United States Patent [19]

Kay

[11] Patent Number: 4,487,813
[45] Date of Patent: Dec. 11, 1984

[54] COMPOSITION CONTROL OF CSVPE HGCDTE

[75] Inventor: Robert E. Kay, Newport Beach, Calif.

[73] Assignee: Ford Aerospace & Communications Corporation, Detroit, Mich.

[21] Appl. No.: 536,018

[22] Filed: Sep. 26, 1983

Related U.S. Application Data

[62] Division of Ser. No. 447,082, Dec. 6, 1982, Pat. No. 4,447,470.

[51] Int. Cl.$^3$ .......................... H01L 9/00; H01L 7/36
[52] U.S. Cl. .................................. 428/620; 148/174; 428/657
[58] Field of Search ................. 428/657, 620; 148/174

[56] References Cited

U.S. PATENT DOCUMENTS 3,619,283 11/1971 Carpenter et al. ................. 148/174

OTHER PUBLICATIONS

C. C. Wang et al., J. Electro. Chem. Soc., vol. 127, No. 1, pp. 175-179, Jan. 1980.
Vohl et al., J. Electronic Materials, vol. 7, No. 5, pp. 659-678, 1978.

Primary Examiner—Veronica O'Keefe
Attorney, Agent, or Firm—Edward J. Radlo; Robert D. Sanborn

[57] ABSTRACT

Method for growing HgCdTe (15) upon a CdTe substrate (5) using a HgTe source (3) and close-spaced vapor phase epitaxy (CSVPE). A processing temperature T of between 520° C. and 625° C. is employed over a processing time t of between approximately ¼ and 4 hours. The thickness A of the grown HgCdTe (15) is a linear function of processing time t. The mole fraction x of cadmium in the HgCdTe (15) is a linear function of temperature T and an exponential function of the mole fraction y of mercury in the source (3). The lower the relative amount of mercury in the source (3), the greater the relative amount of mercury in the end product (15), and vice versa. Any crystal plane and any axial orientation of the CdTe substrate (5) can be used without affecting the rate of growth of the HgCdTe (15), the single crystal nature of the HgCdTe (15), or the mirror-like finish of its surface. At least 90% of the transition between the CdTe substrate (5) and the grown HgCdTe layer (15) occurs within the first 20% of the HgCdTe layer (15); for distances greater than this away from the substrate (5), the HgCdTe (15) exhibits a substantially uniform x.

2 Claims, 5 Drawing Figures

COMPOSITION CONTROL OF CSVPE HGCDTE

This is a divisional application of application Ser. No. 447,082, filed Dec. 6, 1982, which application was awarded a Notice of Allowance on Jan. 20, 1984 now U.S. Pat. No. 4,447,470.

DESCRIPTION

1. Technical Field

This invention pertains to the field of processes for manufacturing HgCdTe (mercury cadmium telluride) for use in infrared detectors and the like.

2. Background Art

Tufte et al., "Growth and Properties of $HG_{1-x}Cd_xTe$ Epitaxial Layers", *J. Appl. Physics*, Vol. 40, No. 11, October 1969, pp. 4559–4568, described the fabrication of HgCdTe having non-sharply defined compositional profiles with roll-offs. HgCdTe fabricated according to the teachings of the present invention, on the other hand, has a sharply defined compositional profile with very little roll-off. These authors use mercury over-pressure to achieve composition control, which is avoided in the present invention.

Becla et al., "A Modified Approach to Isothermal Growth of Ultrahigh Quality HgCdTe for Infrared Applications", *J. Electrochem. Soc.* Vol. 128, No. 5, May 1981, pp. 1171–1173, describes the growth of HgCdTe having non-sharply defined compositional profiles with roll-offs. Curve z=00 of FIG. 1(a) and curves 1 and 2 in FIG. 1(b) correspond to the Cd-free HgTe source material used in the present invention. This reference teaches away from the present invention in that the less mercury used by the authors in their source, the less they obtained in their end product. The reverse is true in the present invention. The reference uses only the (111) substrate plane, while the present invention can use any plane. Becla et al., "Optimization of Isothermal Growth of HgCdTe Layers", *J. Electrochem. Soc.*, Vol. 129, No. 5, May 1982, pp. 1103–1105, describes further work performed by three of these same authors.

Cohen-Solal et al., "Epitaxial (CdHg)Te Infrared Photovoltaic Detectors", *Appl. Phys. Ltrs.*, Vol. 19, No. 10, Nov. 15, 1971, pp. 436–438; and Svob et al, "Influence of the mercury vapor pressure on the isothermal growth of HgTe over CdTe", *J. Appl. Phys.*, Vol. 46, No. 10, October 1975, pp. 4251–4258, assert that the use of mercury over-pressure to obtain HgCdTe is critical. The present invention is able to avoid the use of excess mercury. This is desirable because mercury can cause explosions, the mercury has to be cooled during the evacuation stage, and it is hard to control the precise small amount of mercury required. U.S. Pat. No. 3,472,685 describes earlier work by authors of the above two papers.

U.S. Pat. No. 3,218,204 covers the manufacture of substrates for epitaxial growth of ternary compounds.

U.S. Pat. No. 3,619,283 shows a method of vapor phase epitaxial growth of HgCdTe on a substrate monocrystal of CdTe. However, not disclosed is a method of close-spaced vapor phase epitaxy (CSVPE) as in the present invention. The method disclosed in the reference is not as desirable a process as CSVPE.

U.S. Pat. No. 3,658,582 discloses a method of growing IIb–VIa compounds on substrates, but does not disclose the growth of HgCdTe as in the present invention.

U.S. Pat. No. 3,664,866 discloses a method of vapor phase epitaxy but not a CSVPE method as in the present invention.

U.S. Pat. No. 3,779,803 discloses a film process and not an epitaxial layer process as in the present invention.

U.S. Pat. Nos. 3,884,788 and 3,902,924 disclose methods of liquid phase epitaxy, not vapor phase epitaxy as in the present invention.

DISCLOSURE OF INVENTION

The present invention describes methods for growing HgCdTe (15) epitaxially upon a single crystal substrate of CdTe (5) using a $Hg_yTe$ source material (3). The HgTe (3) can be in any form, e.g., a loose powder, packed power, or a polycrystalline wafer. The method of close-space vapor phase epitaxy (CSVPE) is used. The grown material (15) is P-type. It can then be changed to N-type by means of annealing.

The HgCdTe end product (15) exhibits a sharply defined compositional profile with very little roll-off, i.e., at least 90% of the transition between the CdTe (5) and the HgCdTe (15) occurs within 20% of the HgCdTe (15) thickness, the HgCdTe (15) exhibiting a substantially constant mole fraction of Cd after this distance. None of the cited references show HgCdTe having these desirable characteristics. This offers advantages of reproducibility. Furthermore, this means that the value of x (mole fraction of cadmium in the HgCdTe end product (15)) and the infrared photoconductivity characteristics of the HgCdTe (15) do not change during etching of the HgCdTe (15).

For each of the various possible values of y (mole fraction of Hg in the source material (3)), the value of x is a linear function of processing temperature T. This allows for a high degree of control over the composition of the HgCdTe end product (15).

The composition of the HgCdTe (15) can be controlled over the whole range of infrared detector interest by the stoichiometry of the HgTe source (3) used in the growth process. This makes it possible to eliminate the need for added free mercury and its attendant difficulties.

The HgCdTe (15) can be grown on substrate (5) planes other than the (111) plane and with off-axis orientation. The advantages of this are that one does not have to be as precise in cutting the substrate (5). When the cleavage (110) plane is used, the CLEFT (Cleavage of Lateral Epitaxial Films for Transfer) process of McClelland et al., "A technique for producing epitaxial films on reusable substrates", 37 *Appl. Phys. Ltrs.* 560–562, Sept. 15, 1980, can be used to make the cadmium telluride substrate (5).

BRIEF DESCRIPTION OF THE DRAWINGS

These and other more detailed and specific objects and features of the present invention are more fully disclosed in the following specification, reference being had to the accompanying drawings, in which.

DETAILED DESCRIPTION OF THE PREFERRED EMBODIMENTS

The present specification describes methods for making highly usable HgCdTe 15 grown epitaxially upon a CdTe substrate 5 using the CSVPE method. When the HgCdTe 15 is used as an infrared detector, x (the mole fraction of cadmium in the $Hg_{1-x}Cd_xTe$ end product 15) is desired to be between 0.2 and 0.3, where 0.2 is appropriate for "long wave" infrared detection and 0.3 is appropriate for "short wave" infrared detection.

Figure 1:
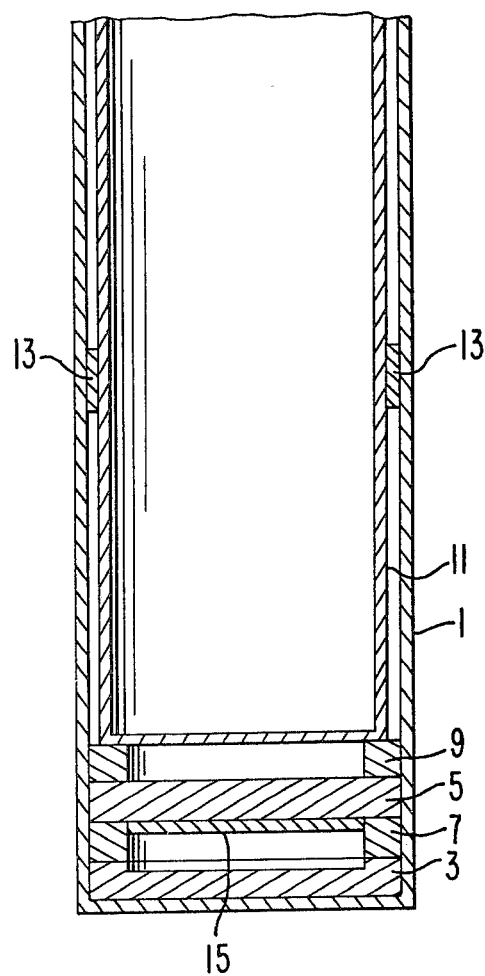
FIG. 1 is a cross-sectional view of an ampoule (1) loaded with precursor materials (3, 5) and at least a portion of the grown end product (15) of the present invention.

FIG. 1 illustrates the precursor materials 3, 5 loaded in an inert ampoule 1, with a layer of HgCdTe 15 at least partially grown upon the substrate 5. First the source material 3, $Hg_yTe$, is placed into the bottom of the ampoule 1, which is typically made of quartz. This source material 3 can exist in any form, e.g., it can be a loose or packed powder or a polycrystalline wafer. It is typically loaded into ampoule 1 to a thickness of 1.5 mm, although all that is necessary is that there is enough source material 3 to grow a HgCdTe layer 15 of the desired size.

A spacing ring 7, which spaces source 3 from substrate 5 and is fabricated of an inert substance such as quartz, is then placed on top of the source material 3, leaving a cylindrical opening above source 3. This opening is normally desired to be as large as possible so that the HgCdTe end product 15 will be as large as possible. The ring 7 is between 0.1 mm and 10 mm in thickness; this range defines what is meant by "close-spaced" in the expression "close-spaced vapor phase epitaxy" (CSVPE) as used in this specification.

If source 3 is a powder, it is placed into a cup (not illustrated) whose rim provides support for ring 7.

Substrate 5, a single crystal of stoichiometric CdTe, is placed on top of ring 7 and will subsequently provide support for the HgCdTe end product 15. Substrate 5, typically about 1 mm thick, must be thick enough to support the end product 15, yet thin enough for low cost and for relative transparency to infrared radiation in the case back illumination (see FIG. 5) will be used for the HgCdTe photodetector 15. Any crystal plane of substrate 5, and any axial orientation of any crystal plane, can be used for the chemical/mechanical growth of the HgCdTe 15 without changing the thickness A of the HgCdTe 15 as a function of processing time t, the single crystal nature of the HgCdTe 15, or the mirror-like finish of the HgCdTe 15 surface. Since off-axis orientations can be used, one does not have to be as precise in cutting substrate 5. When the (110) cleavage plane is used, the CLEFT process can be used to make substrate 5. Of the above cited references, only Tufte indicates a belief in the feasibility of growing HgCdTe on other than a (111) plane.

Ring 9, made of an inert material such as quartz, separates substrate 5 from piston 11. Piston 11, having a cylindrical outer shape and fabricated of an inert substance such as quartz, is inserted within ampoule 1 on top of disc 9, and exerts mild downward pressure on source 3, ring 7, substrate 5, and ring 9.

Sources 3, ring 7, substrate 5, ring 9, and piston 11 are loaded into ampoule 1 within an atmosphere control station (not illustrated) filled with an inert gas such as argon. The space between piston 11 and ampoule 1 is then evacuated from above to approximately $10^{-5}$ torr to $10^{-8}$ torr within the same control station. Then seal 13 is formed between piston 11 and ampoule 1 to retain the vacuum atmosphere for subsequent processing. Seal 13 is normally made approximately 6 cm above the bottom of piston 11 in the case where the seal is formed by melting piston 11 to ampoule 1 by a torch, so that heat from the torch will not affect the reactants.

Then ampoule 1 is placed in a preheated oven (not illustrated) for a predetermined processing time t at a predetermined unvarying temperature T between 520° C. and 625° C. At the end of time t, ampoule 1 is taken out of the oven and cooled at room temperature.

Figure 3:
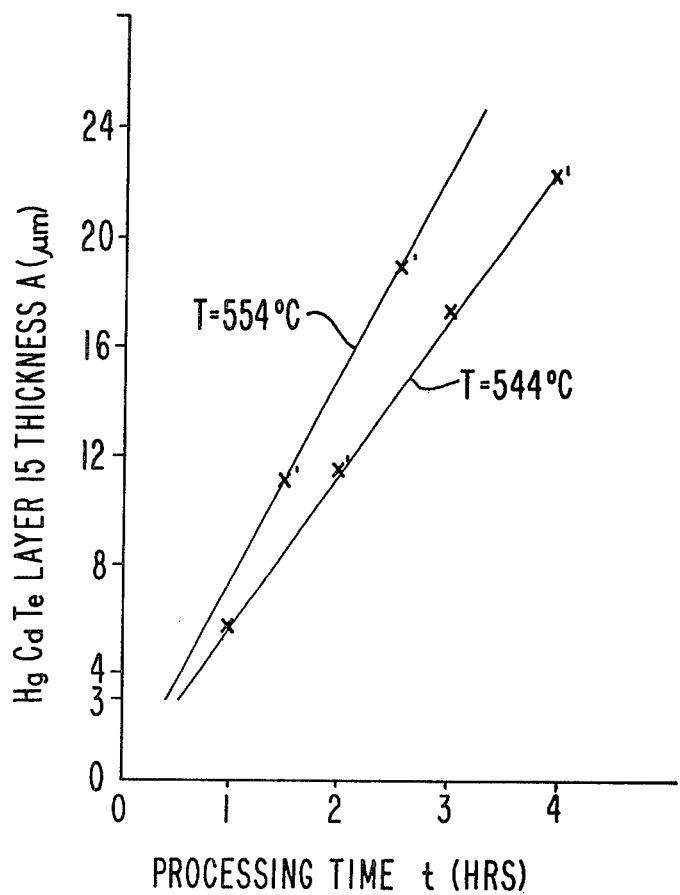
FIG. 3 shows thickness A of the end product HgCdTe layer (15) as a function of processing time t based upon empirical data for two processing temperatures T.

The processing time t is selected from the range of approximately ¼ hour to 4 hours, depending upon the desired thickness A of the end product 15. FIG. 3 shows A as a function of processing time t for two processing temperatures T, 554° C. and 544° C. The two plots illustrated on FIG. 3 were obtained using a $Hg_{.9}Te$ source 3 and a spacing of 1 mm between source 3 and substrate 5. For any temperature T within the 520° C.–625° C. temperature range, A is a linear function of t. The symbols X and X' on FIG. 3 represent actual empirical data. The symbol X indicates a data point from an experiment where the (111)A plane of substrate 5 was used. The symbol X' indicates four overlapping data points representing experiments performed on each of the following planes of substrate 5: (111)A, (111)B, (110), and (100).

Thickness A can range between 3 microns and 24 microns. Preferable values for A are between 5 microns and 15 microns. It is not desirable for A to be too large because the charge diffusion path length within layer 15 is limited. It is not desirable for A to be too small because it is desired for all the incident photons of infrared energy to be absorbed within layer 15.

As T changes, the slope of the FIG. 3 curve changes slightly, but it remains linear over the range of suitable processing times t.

Figure 4:
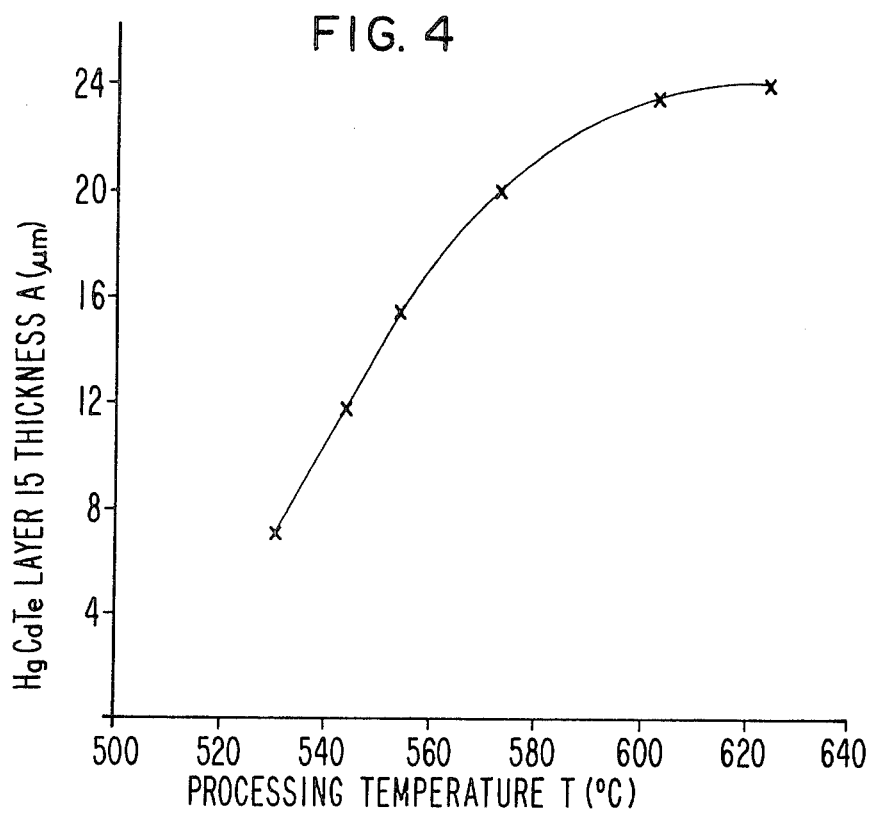
FIG. 4 is a plot of HgCdTe layer (15) thickness A as a function of processing temperature T based upon empirical data.

Thickness A of layer 15 increases with temperature T in a curvilinear fashion, as illustrated in FIG. 4, which is based upon a series of experiments performed at a constant processing time t of 2 hours and a $Hg_{0.9}Te$ source 3. A increases rapidly with T up to about 580° C. or an A of 20 microns. Thereafter, the growth rate of layer 15 is less rapid. This indicates that some constituent or growth mechanism becomes limiting at higher temperatures or with thicker layers.

Figure 5:
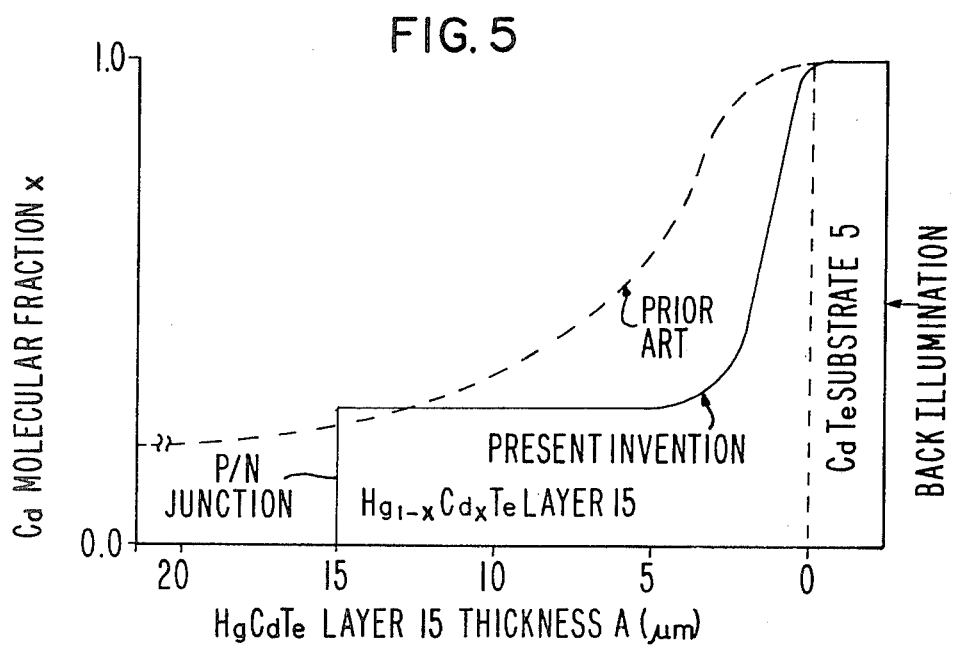
FIG. 5 shows the compositional profile of a HgCdTe layer (15) fabricated according to the teachings of the present invention, and, in dotted lines, a compositional profile representative of the prior art.

A representative measured compositional profile of the HgCdTe end product 15 is shown by solid lines in FIG. 5, which illustrates that HgCdTe 15 grown according to the teachings of the present invention exhibits a sharply defined profile, i.e., at least 90% of the transition from the CdTe substrate 5 to the HgCdTe layer 15 (measured in terms of the change in x) occurs within the first 20% of the finished layer 15 (measured as distance from substrate 5). This implies that there is very little roll-off in the profile, since, by definition, x can change its value only up to 10% over the remaining 80% of the HgCdTe 15.

FIG. 5 illustrates a 15 micron thick layer 15 as measured by EDAX (Electron Dispersion Analysis by X- rays). In this case, 90% of the transition in x occurs within the first 3 microns of layer 15. In dotted lines, FIG. 5 illustrates a compositional profile of a HgCdTe layer grown by the CSVPE process by a representative one of the prior art, i.e., the Cd curve of FIG. 3 of the second Becla article cited above.

The fact that the end product 15 exhibits a sharply defined profile with very little roll-off (not true in any of the prior art layers formed by vapor phase epitaxy) means that reproducibility is enhanced, and the x value and infrared characteristics can be kept invariant during subsequent etching of the HgCdTe 15.

Figure 2:
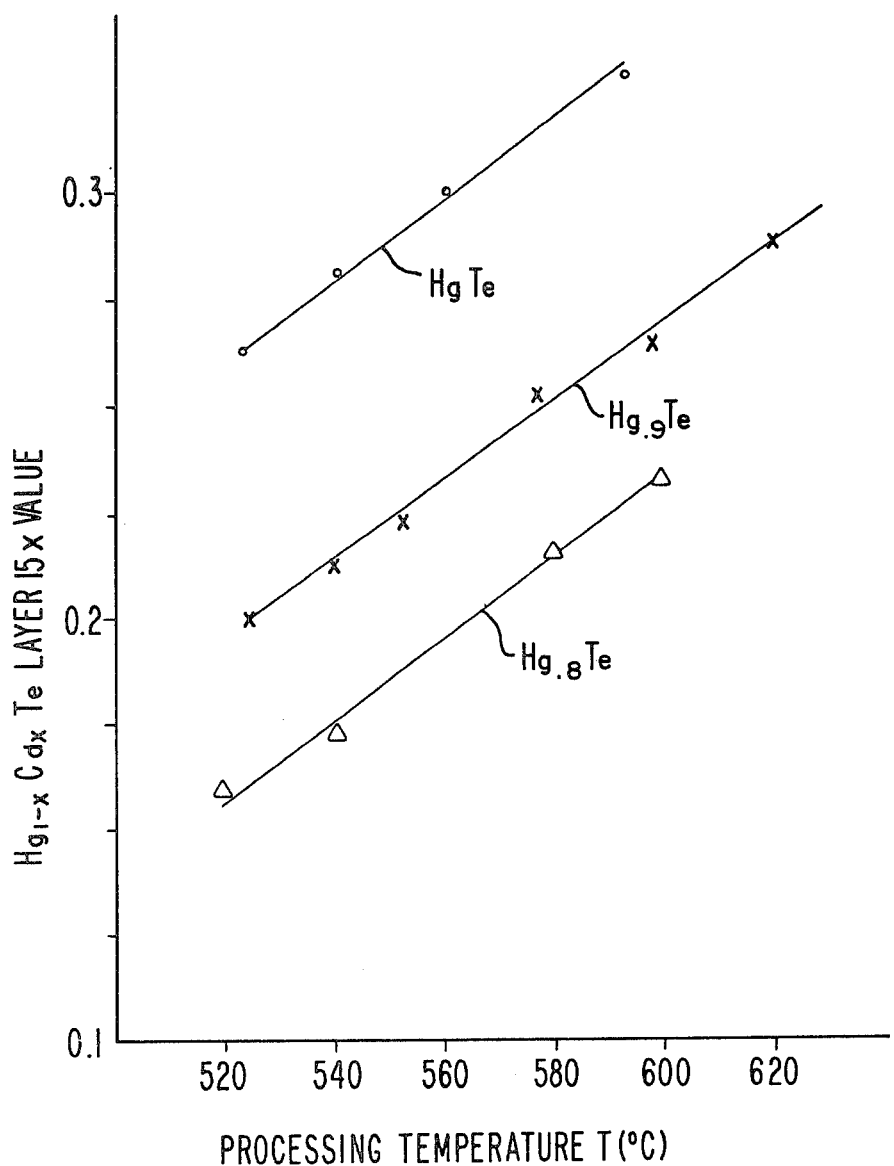
FIG. 2 shows, for each of three different values of y, x as a function of processing temperature T based upon empirical data.

FIG. 2 illustrates how x varies as a function of processing temperature T for each of three values of y, based upon empirical data indicated by series of circles, X's, and triangles (representing $y=1.0$, 0.9, and 0.8, respectively). Note that these three functions are all linear. The slope of each line is approximately 0.001 when T is expressed in degrees C. For $y=1$, x approximately equals $0.00T-0.26$. For $y=0.9$, x approximately equals $0.00T-0.323$. For $y=0.8$, x approximately equals $0.00T-0.362$.

The $y=0.9$ composition is particularly useful, because it enables the realization of the useful $x=0.2$ and $x=0.3$ end products 15.

FIG. 2 thus shows how one can achieve a certain desired level of x, and hence sensitivity to a certain region of the infrared spectrum, by adjusting the value of y in the source 3, and the processing temperature T, without resorting to the use of mercury overpressure.

For a value of y other than those illustrated, a line can be interpolated between illustrated lines.

Note that FIG. 2 shows that, for any given temperature within the suitable temperature range of 520° C. to 625° C., the less mercury in the HgTe source 3, the more mercury in the HgCdTe end product 15, and vice versa. This is the opposite of the teachings of the first Becla article cited above, whose FIG. 1(a) shows that the less mercury in the authors' HgTe source, the less mercury in their HgCdTe end product. (Note that y in this Becla article corresponds to $1-y$ of the present specification.)

For any T, x as a function of y is a slightly rising exponential. This function can be graphed as an aid to fabrication of a layer with the desired x value. Converting x as a function of y to x as a function of y and T simply requires the addition of the fixed term $0.00T$.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A layer of HgCdTe epitaxially grown on a CdTe substrate using the closed-space vapor space epitaxy method, wherein the thickness of the grown HgCdTe layer is between 3 microns and 24 microns, and the mole fraction of cadmium in the HgCdTe which is situated greater than 20% of the HgCdTe layer thickness away from the CdTe substrate varies by no more than 10% as a function of distance from the substrate; wherein said layer is formed by a process in which a HgTe source material and CdTe substrate are spaced apart from each other by a distance of between 0.1 mm and 10 mm; and the source material and the substrate are then heated together at a constant processing temperature of between 520° C. and 625° C. for a fixed processing time of between ¼ hour and 4 hours.

2. The layer of claim 1 in which the source material is $Hg_yTe$, where $0.8 \leq y \leq 1$.

* * * * *